United States Patent
Rostron (10) Patent No.: US 8,861,155 B2
(45) Date of Patent: Oct. 14, 2014

(54) HIGH-IMPEDANCE FAULT DETECTION AND ISOLATION SYSTEM

(71) Applicant: SSI Power, LLC, Hampton, GA (US)

(72) Inventor: Joseph R. Rostron, McDonough, GA (US)

(73) Assignee: Southern States, LLC, Hampton, GA (US)

( * ) Notice: Subject to any disclaimer, the term of this patent is extended or adjusted under 35 U.S.C. 154(b) by 72 days.

(21) Appl. No.: 13/864,611

(22) Filed: Apr. 17, 2013

(65) Prior Publication Data

US 2013/0229735 A1 Sep. 5, 2013

Related U.S. Application Data

(63) Continuation-in-part of application No. 13/229,808, filed on Sep. 12, 2011, and a continuation-in-part of application No. 13/229,095, filed on Sep. 9, 2011, now Pat. No. 8,659,862, and a continuation-in-part of application No. 13/217,318, filed on Aug. 25, 2011, now Pat. No. 8,717,721.

(51) Int. Cl.
*H02H 3/08* (2006.01)
*G01R 31/08* (2006.01)
*H02H 7/26* (2006.01)

(52) U.S. Cl.
CPC .............. *H02H 3/083* (2013.01); *H02H 7/261* (2013.01); *G01R 31/08* (2013.01)
USPC .......................................................... 361/76

(58) Field of Classification Search
CPC ....... H02H 3/083; H02H 3/343; H02H 3/387; G01R 29/18; G01R 31/08
USPC .......................................................... 361/76
See application file for complete search history.

(56) References Cited

U.S. PATENT DOCUMENTS

2009/0088989 A1* 4/2009 Guzman-Casillas ........... 702/58

* cited by examiner

*Primary Examiner* — Jared Fureman
*Assistant Examiner* — Kevin J Comber
(74) *Attorney, Agent, or Firm* — Mehrman Law Office, PC; Michael J. Mehrman (57) ABSTRACT

A high-impedance system that utilizes asynchronous, line-mounted single-phase current and voltage sensors with rolling data logs and a common clock or other event trigger to synchronize the signals to a common time scale whenever a fault event is detected. The use of asynchronous, single-phase current and voltage angle sensors with rolling data logs, along with a common clock to synchronize the signals to common time scale whenever a fault event is detected, avoids the need for simultaneous three-phase current measurement. Integration of information, triggered by the detection of a loss or sufficient change of current on three or four (with a neutral current) devices, is used to determine the presence and direction of high-impedance faults and then report it, typically to a central control center via SCADA or another communication system, which implements fault isolation.

15 Claims, 5 Drawing Sheets

HIGH-IMPEDANCE FAULT DETECTION AND ISOLATION SYSTEM

REFERENCE TO RELATED APPLICATIONS

This application claims priority to U.S. patent application Ser. No. 13/217,318 (now U.S. Pat. No. 8,717,721); U.S. patent application Ser. No. 13/229,095 (now U.S. Pat. No. 8,659,862); U.S. patent application Ser. No. 13/229,808 (Pub. No. 2012-0062239); which claims priority to U.S. Provisional Patent Application Ser. No. 61/381,518; which are incorporated by reference.

TECHNICAL FIELD

The present invention is directed to electric power systems and, more particularly, to a high-impedance fault detection and isolation system using distributed asynchronous line-mounted phase current sensors and computational phase current sequencing of recent history event files to verify the occurrence of a high-impedance fault, identify the faulted phase, and determine the directionality of the fault.

BACKGROUND

Line mounted fault detectors (also known as faulted circuit indicators or FCI's) are used in distribution circuits to identify electric power lines where high current faults have occurred. Overcurrent detectors in distribution voltage circuits at electric utilities are commonly used to detect faults that produce significant increases in current. This works well for many faults because many distribution circuit faults cause currents well in excess of the normal load current. An FCI is commonly mounted directly to an individual phase conductor and is usually installed there by a technician using an insulating stick called a "hot stick" to install and remove the device from the power line while the conductor remains energized.

Although conventional FCI are effective at detecting low-impedance, high-current faults, they are not effective for detecting high-impedance, low-current faults even when they send their information to a common monitoring point. This is because high-impedance faults, for example where the fault current is less than about 1.5 times the normal current, remain below the triggering threshold of the overcurrent FCI. As a result, conventional FCI technologies only detect and report high-current fault events.

Some FCIs have the capability of storing data logs and providing "event" reports giving full current waveform data, with each FCI providing a log for its associated phase conductor (i.e., event reporting on a single-phase basis). In addition, there are conventional overcurrent devices with the ability to determine the location of faults on radial lines, but they only trigger for high-current faults. As a result, virtually all of the current technologies utilized on power lines for detecting and locating low-impedance, high-current faults are ineffective for detecting high-impedance, low-current faults.

For high-impedance fault detection, conventional approaches used in substations require the use of three synchronized current sensors and synchronized voltage signals to determine the existence of a high-impedance fault. But even with three-phase synchronized information available, conventional technology is not capable of determining the location of the fault or isolating the specific line segment where the fault has occurred on power lines with multiple tap points. Moreover, existing fault monitoring techniques located between the substations are not able to detect the presence of high-impedance faults, which limits high-impedance fault location detection to devices located in substations.

High-impedance faults can generally be defined as faults where the fault current is less than about 1.5 times normal phase current. Current FCI technology used for overcurrent protection is typically not capable of providing any indication of the presence these high-impedance faults. When high-impedance faults occur, which account for about 70% of faults, they present significant safety concerns to the public because they are often caused by energized lines touching trees or broken, still energized lines touching the ground creating significant electrical hazards. Since high-impedance faults are not detectable by conventional overcurrent FCI sensors, their location can be nearly impossible to find. At present, while detection at substations is possible, determination of the location down to a specific segment of distribution line is presently accomplished in most cases by visual inspection of arcing or the fires they cause.

Single-phase current monitors are not capable of determining the location of these dangerous high-impedance faults. While some currently available techniques have been used to detect the presence of high-impedance faults by detecting a harmonic signature characteristic of a fault caused by "arcing" in the faults, these techniques do not determine the location or direction to the fault. Finding the location of the fault requires some hint at which direction the fault is located otherwise the entire line must be inspected. In addition, visual inspection also has limits because things like cracks in insulators can be difficult to find visually, for example when a crack is on the other side of the insulator from the line of sight.

The result is that a distribution circuit can experience a high-impedance fault and the utility crew may not be able to even detect the presence of the fault because the overcurrent detectors typically installed on distribution lines do not respond to the current levels created by the high-impedance fault. Even when more sophisticated (and expensive) equipment is installed to detect the presence of high-impedance faults, the location or the direction to the fault from the monitoring equipment cannot be detected. With currently available technology, detecting the location or the direction to the fault from the monitoring equipment presently requires even more expensive solutions.

As a result, there is a persistent need for a lower cost solution to detecting high-impedance faults on distribution circuits to increase adoption of the technology and achieve the associated public safety benefits.

SUMMARY OF THE INVENTION

The present invention meets the needs described above through a high-impedance fault detection system for distribution circuits using multiple independent single-phase current sensors producing asynchronous event data. Integration of information, triggered by the detection of a loss or sufficient change of current on three or four (with a neutral current) devices, is used to computationally determine the presence and direction of high-impedance faults and then report it, typically to a central control center via SCADA or another communication system, which implements fault isolation. The high-impedance fault detection system utilizes asynchronous, line-mounted single-phase current and voltage sensors with rolling data logs and a common clock or other "event trigger" to synchronize the signals to a common time scale whenever a fault event is detected. The use of asynchronous, single-phase current and voltage angle sensors with rolling data logs, along with a common clock to synchronize the signals to common time scale whenever a fault event is detected, avoids the need for simultaneous three-phase current measurement. Removing the requirement for synchronous three-phase current monitoring also allows conventional line-mounted, single-phase current sensors to be utilized. This modification produces significant savings allowing the high-impedance fault detectors to be included at more locations in the distribution network, producing more robust high-impedance fault isolation and improved network safety.

In view of the foregoing, it will be appreciated that the present invention provides an improved high-impedance fault isolation system for a three phase electric power circuit. The specific structures and techniques for accomplishing the advantages described above will become apparent from the following detailed description of the embodiments and the appended drawings and claims.

DETAILED DESCRIPTION OF THE EMBODIMENTS

The present invention may be embodied in a high-impedance fault detection and isolation system for distribution circuits using multiple independent phase current sensors producing asynchronous event data. Specific techniques for detecting the presence of high-impedance faults using simultaneous three-phase current monitors are described in U.S. patent application Ser. No. 13/217,318; specific techniques for determining the direction to the fault from the sequenced currents are described in U.S. patent application Ser. No. 13/229,808; and specific techniques for sectionalizing the distribution network to isolate detected faults are described in U.S. patent application Ser. No. 13/229,095, which are incorporated by reference.

While the techniques described in these prior applications can be used to successfully detect, locate and respond to high-impedance faults, obtaining synchronized three-phase current and voltage monitoring data can be a relatively expensive solution. In many cases, the market for distribution switchgear is sufficiently price sensitive to block this solution despite the known risks of high-impedance faults to public safety. These same issues exist in the application of single-phase current sensor devices to underground cables. The present invention provides a less expensive alternative through the use of asynchronous, line-mounted single-phase current and voltage sensors with rolling data logs and a common clock or other "event trigger" to synchronize the signals to a common time scale whenever a fault event is detected. The single phase current waveforms and then computationally sequenced and analyzed to verify the occurrence of a high-impedance fault, identify the faulted phase, and determine the directionality of the fault.

The use of asynchronous, single-phase current and voltage angle sensors with rolling data logs, along with a common clock or event trigger to synchronize the signals to common time scale whenever a fault event is detected, avoids the need for simultaneous three-phase current and voltage measurement. Importantly, removing the requirement for synchronous three-phase current monitoring allows conventional line-mounted, single-phase current sensors to be utilized. This modification produces significant savings allowing the high-impedance fault detectors to be included at more monitoring stations in the distribution network including many more sectionalizing switch locations away from the substations, producing more robust high-impedance fault isolation capability and improved network safety.

In the present invention, the synchronous three-phase current monitoring device described in U.S. patent application Ser. No. 13/217,318 is replaced with three asynchronous, line-mounted, single-phase current sensors that each maintain their own rolling data logs of their respective phase current waveforms. To provide fault directionality, an asynchronous, line-mounted single-phase voltage angle sensor may also maintain a rolling data log of the voltage angle waveform. Detection of a potential fault event triggers the data logs to be stored locally and uploaded to a controller for computational analysis. Each event data log includes the recent asynchronous phase current (and optionally voltage angle) waveform history just prior to and immediately following the triggering event and may also include a common time reference, such as a GPS clock signal acquired by the sensor and recorded as part of its data log file. The controller receives the waveform data filed from the various sensors and computationally analyzes the event data using the event trigger or a synchronizing clock signal to place the phase current and voltage angle waveforms on a common time scale. Once the phase current and voltage angle waveforms have been placed on a common time scale, the computational sequencing and analysis techniques described in U.S. patent application Ser. No. 13/229,808 are implemented to locate the fault and the techniques described in U.S. patent application Ser. No. 13/229,095 are implemented to sectionalize the distribution network to isolate the fault.

The asynchronous event data (independent single-phase phase current measurements) obtained from the individual phase current sensors are typically computationally combined and sequenced using a common time signal, such as a GPS or local clock acquired by the sensors themselves or a local remote transmission unit (RTU) serving the sensors, to compute the magnitude and phase angle of the neutral current (or zero-sequence current) with sufficient accuracy to detect the presence of a high-impedance fault, determine which phase is faulted, and (if desired with an additional voltage angle measurement taken at or near the current monitoring location) the direction to the fault from the current monitoring equipment to localize the fault. That is, the location of the fault is determined with the precision of being located between two adjacent current monitoring locations.

An event trigger may be detected by any current sensor (or the voltage angle sensor, if present), which sends a "wake-up" call to the other sensors causing all three phase current sensors (and the voltage angle sensor, if present) to respond. If the sensors are not configured to record a GPS clock signal, the wake-up call causes each sensor to generate a simultaneous event time mark. Each device also locally saves and uploads the contents of the data log to a controller, which is typically located at the monitoring site or at a remote control location. The triggering event can be any single-phase current sensor detecting an extended current-zero condition sufficiently longer than a normal zero crossing to indicate operation of a breaker or circuit recloser. The extended current-zero condition can be used as the triggering event because many high-impedance faults involve an initial current surge that is cleared through breaker or circuit recloser operation, which may reenergize the faulted line even though the high-impedance fault condition remains. The invention steps in at this point, causing a upload of the recent event logs and computational analysis of the phase currents to determine whether a high-impedance fault has in fact occurred and, if so, the identity of the faulted pause and the directionality of the high-impedance fault from the monitoring location. Any other unusual change in a phase current characteristic of a high-impedance fault may also be used as an event trigger. For example, an abrupt or transient current change, significant harmonic content or other waveform distortion, or unusual change in the amplitude or phase angle of the phase current may also be detected as triggering events. The system may err on the side of event detection, since event detection only triggers a data upload and analysis procedure to confirm whether a high-impedance fault has actually occurred, and actual switch operation only occurs after the computational analysis has confirmed that the high-impedance fault has actually occurred.

While the use of a synchronizing clock signal, such as a GPS clock, simplifies the computations, an alternate approach uses the "pre-fault condition" to determine the existence of a fault from a significant change in the balance of the power flow on the line before and after the triggering event without the need for a synchronizing time signal. The change in the power flow balanced from the pre-fault condition to the fault condition is then used to identify the faulted phase and determine the directionality of the fault (i.e., the direction from the monitoring location to the fault). Using the power flow balanced before and after the fault improves the accuracy of the fault detection and directionality determination by preventing an unbalanced power flow condition prior to the fault from masking the fault or otherwise making fault detection and directionality determination more difficult.

As a further useful technique, the pre-fault power flow balance can be used to synchronize the single-phase waveforms to a common time scale, typically by assuming that the pre-fault phase currents sum to zero or a local minimum as the mechanism to align the current waveforms on the common time base. Once the phase current wave forms have been aligned on the common time scale using pre-fault unbalance minimization as the alignment basis, the post-fault currents are sequenced to identify the faulted phase and determine the directionality of the fault. For this approach, the timing of the voltage angle measurement with respect to the phase current measurements at the time of the triggering event is sufficiently accurate for the purposes of faulted phase identification and determination of the directionality of the fault. In other words, the pre-fault to post-fault changes in the current phase waveforms combined with the voltage angle reference at the time of the event trigger is sufficient for the purpose of faulted phase identification and directionality even though the voltage angle waveform may not be strictly synchronized with the common time reference used to align the phase currents on the common time scale.

Although the fault detection system may be implemented without a synchronizing clock signal, a synchronizing clock signal simplifies and improved the accuracy of the current sequencing and other computations that follow. The common time reference can come from any sensor or another device (e.g., the local sectionalizing switch, GPS, or the central controller), which is transmitted to the other sensors and used as a time mark to put them all on the same time basis to directly synchronize the phase current and voltage angle waveforms. This makes post-fault processing of the synchronized data from the event data logs possible with a low processing power microchip or other onboard computer to determine the faulted phase and directionality of the fault. As this approach utilizes event detection with computational fault verification as opposed to a direct protection approach, the time delay required to perform the processing does not interfere with any of the other direct fault protection and clearing functions installed on the power line. However, a significant benefit may be realized by using the present invention to verify and determine the location of faults when restoring the circuit to avoid reclosing into faults, which can further damage equipment that may already have been damaged by the fault and potentially take the equipment out of service entirely and thereby extend the outage for the affected customers.

To increase the cost efficiency of this solution, the event data reporting devices providing the asynchronous phase current and voltage angle measurements can be triggered only upon a detected loss or sufficient change of any phase current to transmit their event data on an as-needed basis. The triggered event data is then computationally combined and sequenced to create necessary information (typically the magnitude and phase angle of the neutral current or zero-sequence current) to effectively turn the loss or sufficient change in phase current data into useful information that indicates the presence and direction of a high-impedance fault.

Importantly, this approach can also be used to determine which phase is faulted by computationally determining the magnitudes and relative phase angles of the sequence currents by using a GPS time signal or other available reference clock or event trigger as a timing reference. This allows the use of relatively inexpensive current detectors, each independently and asynchronously measuring currents, to provide the data used to perform more complicated functions previously reserved for complete, synchronized three-phase voltage and phase current magnitude and phase angle measurements sent to conventional relays or controllers. The techniques of the present invention can also be used to turn the monitoring equipment on and off, as desired, based on the detection of a loss or sufficient change of a phase current.

With conventional technology, a persistent problem exists when a recloser or substation detects the presence of a high-impedance fault through simultaneous measurement of phase currents, voltages and phase angles, yet still does not have the ability to determine or localize the location of the fault as there are many line taps on the distribution circuit and the location of the faulty one is not detectable with sufficient resolution to isolate the faulted line or equipment to allow restoring the service. The present invention, on the other hand, may operate adequately with any available reference time signal for many distribution systems. With the addition of either a single voltage phase angle measurement synchronized with the current measurements, or a time synchronized voltage phase angle data from remote reference voltage, the system can be used to determine the direction to the fault at each sensor group node (i.e., each current monitoring station).

It should be noted that the voltage angle measurement is only needed to determine fault direction and not the presence of the fault and identification of the faulted phase, which the present invention can reliably determine with only the asynchronous phase current measurements. The determination of the direction from a monitoring station to the high-impedance fault using the classical techniques requires a high precision synchronized voltage measurement on all three phases. In some cases, line mounted current monitoring devices using capacitive coupling through air to determine voltage magnitude and phase angle may not provide sufficiently high precision because environmental effects of moisture and industrial pollution cause significant magnitude and phase angle errors. In the present invention, a voltage measurement device determining only the voltage phase angle of voltage with sufficient precision, without regard to magnitude accuracy, is sufficient to determine the direction from the current monitoring location to the high-impedance fault once the faulted phase has been identified. When this approach is used, no other (conventionally high cost) synchronizing method is needed to obtain sufficient precision to determine the direction to the high-impedance fault from the monitoring location.

The consolidation point of the asynchronous current monitoring data (plus voltage phase angle data if improved reliability in the determination of the direction to the high-impedance fault from the current monitoring location is desired) can either be implemented a base unit near the current monitoring location, or it can be integrated into one or more of these line mounted current monitoring devices. As another option, the measured data may be transmitted to a local or remote control location, for example with SCADA or other communication equipment. In particular, a centralized control location may be utilized to monitor all (or a subset) of the current (and voltage if desired) monitoring locations and determine the presence of high-impedance faults, identify the faulted phase, and determine the direction from multiple (at least two) monitoring locations to the fault to localize the fault (i.e., determine the location of the high-impedance fault with the precision of being located between two adjacent monitoring locations).

The present invention is compatible with conventional line mounted phase current sensors. Currently available examples include Horstmann Fault Indicators (for medium voltage networks), Fisher Pierce 1548FH-ANC3-R-B-A Overhead Fault Circuit Indicator; Fujian CEE Installation Co., Ltd. Overhead Fault Circuit Indicator, GridSense Line Fault Detection Sensor, and SEL fault circuit indicators. Event data (e.g., asynchronous, independent phase current measurements) can be triggered, captured and uploaded by conventional RF devices to another location. Voltage data can similarly be triggered, captured and uploaded by conventional RF devices to another location. The controller (local or remote) of the invention receives the current measurements from suitable line mounted sensors, receives a GPS or other timing signal for use as a reference time signal, may also obtain voltage phase angle data (typically from a measuring device the nearest monitored substation to the current monitoring location) as desired, and performs the following, which are typically performed at multiple monitoring locations to determine the location of the high-impedance fault with the precision of being located between two adjacent monitoring locations:

1) Trigger collection of and transmission data on a current "turn off" or change event so that high-impedance faults can be detected that are not otherwise detected by single phase overcurrent devices.
2) Combine asynchronous single-phase current information from multiple phases to create a complete set of data for doing fault detection and direction determinations.
3) Synchronize event data using GPS or other reference time signals to obtain a common time based synchronization of these independently collected sets of data.
4) Use voltage angle reference data co-collected with the phase current data to create a three phase data set.
5) Sequence the currents to determine the magnitudes and phase angles of the sequence currents to detect the presence of the fault, identify the faulted phase, and determine the direction of the faulted phase from the monitoring location.

Figure 1:
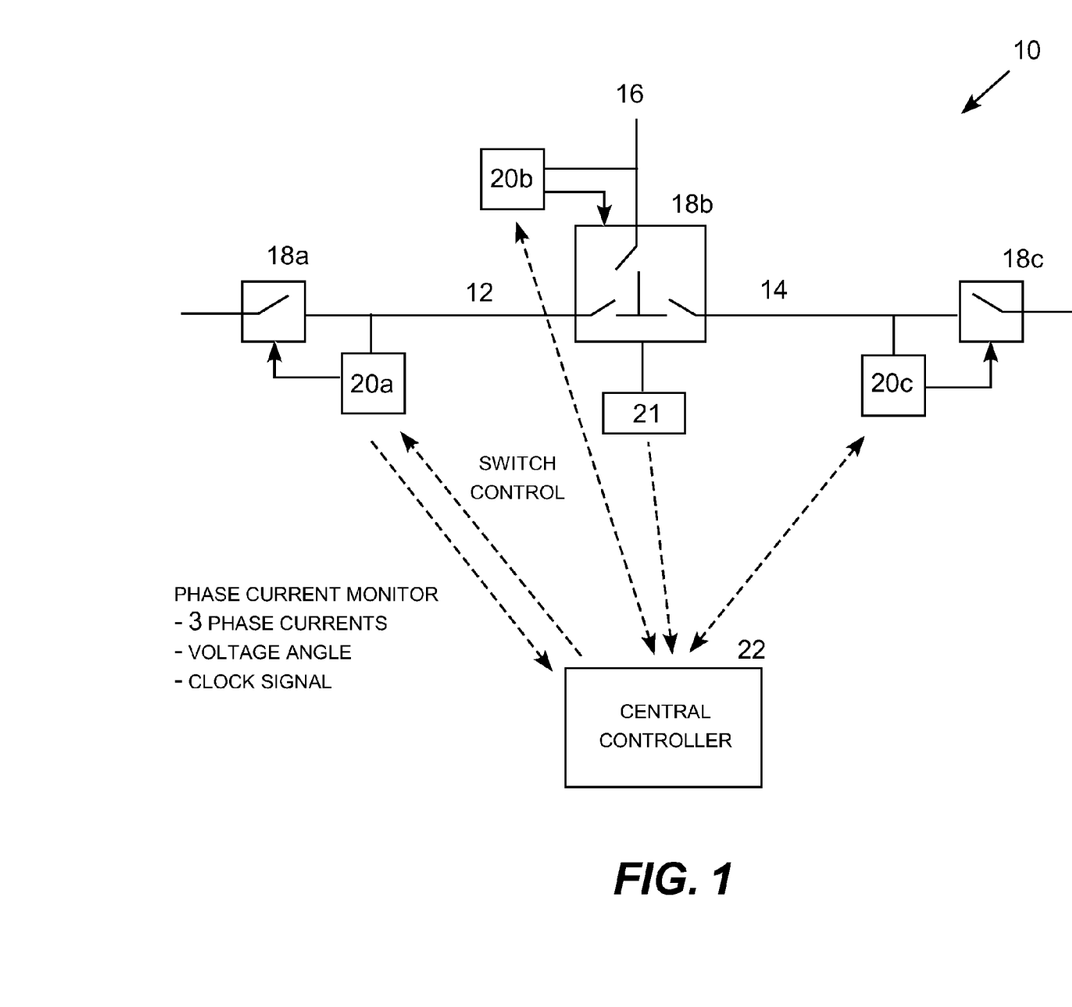
FIG. 1 is a one line diagram of a high-impedance fault detection and isolation system using distributed line-mounted phase current sensors.

Turning now to the figures, FIG. 1 is a one line diagram of a high-impedance fault detection and isolation system 10 using distributed line-mounted phase current sensors 20a-c. The illustrative portion of the distribution network includes three line segments 12, 14 and 16 (each representing a three-phase power line segment) in a "T" configuration and three sectionalizing switches 18a-c under the control of a central controller 22. When a fault occurs on the distribution network, for example when a tree limb contacts or to comes too close to with one of the phase conductors, the central controller 22 operates one or more of the switches to isolate (disconnect) the faulted line segment while keeping the non-faulted segments in service.

To implement fault isolation, the central controller 22 needs to receive or determine an indication that a fault has occurred, the phase on which the fault has occurred, and the direction of the fault from a number of monitoring locations. The line current sensors 20a-b along with the voltage angle sensor 21 provides the controller 22 with the required information. While low-impedance faults producing high fault currents are easily detected and in most cases automatically isolated through breaker operation, high-impedance faults producing low currents (which is possible, for example, with arcing faults to tree limbs or other obstructions coming near power lines) are more difficult to detect. The system 10 shown in FIG. 1 for an illustrative portion of an electric power distribution network may be repeated at multiple locations throughout the network to implement a network-wide high-impedance fault detection and isolation system.

Because the system 10 is designed to detect and isolate high-impedance faults, it cannot rely on high fault currents. The system therefore utilizes three phase current measurements, (optionally) a voltage angle measurement, and (optionally) a synchronizing clock signal to place the current and voltage measurements on a common time scale. The controller analyzes this data to sequence the currents (i.e., compute the positive sequence, negative sequence, and zero sequence currents) at each monitoring location 20a-c. From the sequence currents, the controller identifies the faulted phase and the direction of the fault from each monitoring location to the fault, which allows the controller to identify the particular line segment where the fault is located.

It should be appreciated that any of the components may be configured with all or a portion of the system intelligence, including the intelligence to detect triggering events, maintenance of the synchronizing clock or the intelligence to place the current and voltage waveforms on a common time scale using historical data in lieu of a synchronizing clock, the intelligence to perform the current sequencing computations to identify the faulted phase and directionality of the fault, and the intelligence to determine the appropriate sectionalizing switch operations and direct switch operation. Different configurations will be advantageous depending on which components are obtained from third parties and which components are amenable to customization. In order to implement a coordinated system analysis and switching program, the intelligence to determine the appropriate sectionalizing switch operations and direct switch operation will usually be performed by a central control station with the individual switching stations communicating with the central control station via SCADA or a similar distributed control architecture.

Figure 2:
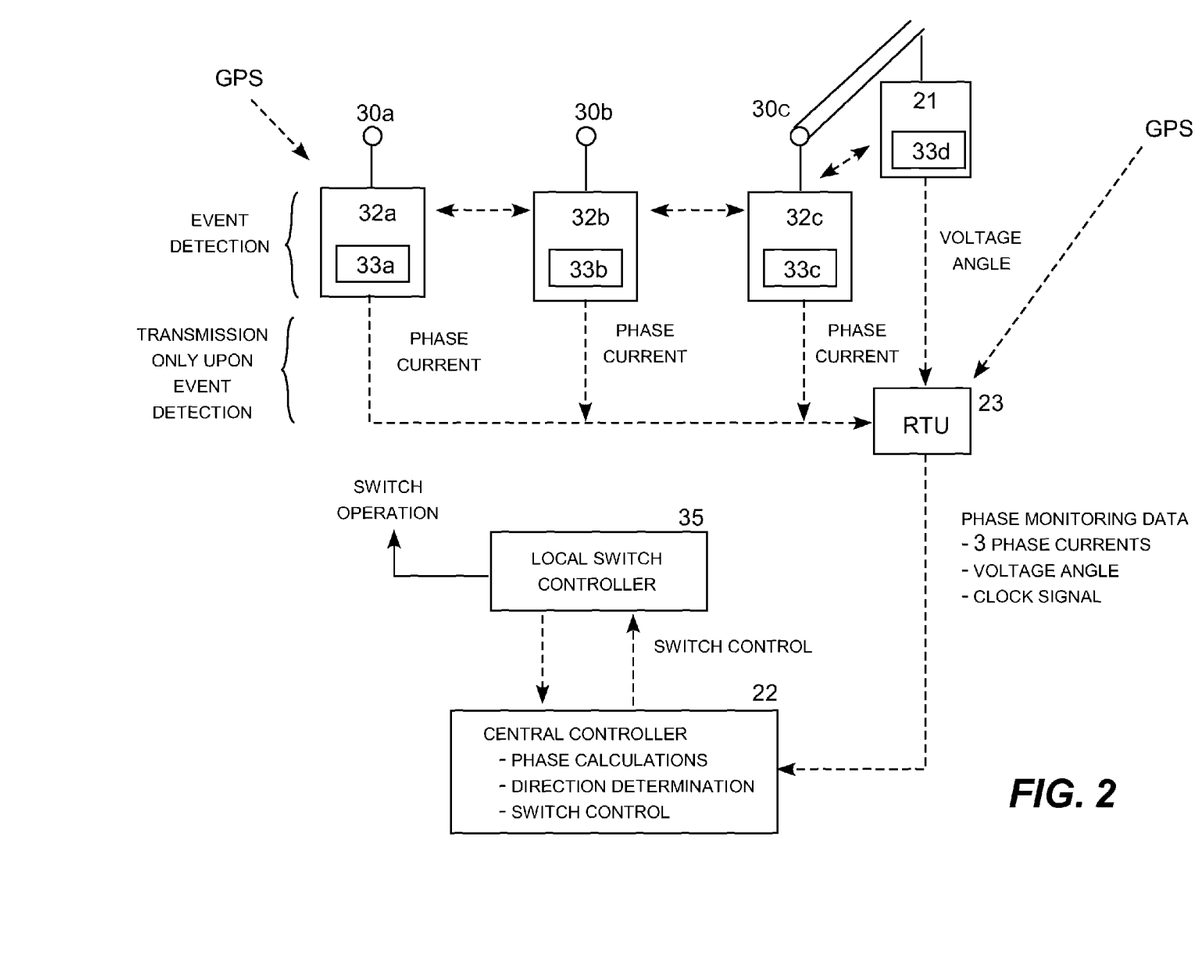
FIG. 2 is a block diagram of a three phase high-impedance fault detection and direction detector.

FIG. 2 illustrates one possible configuration for the monitoring unit. Each phase conductor 30a-c has an associated asynchronous, line-mounted current sensor 32a-c. A local controller 35 operates the sectionalizing switches 18a-c (shown in FIG. 1) typically in response to coordinated operation commands received from a central controller 22. Each current sensor has a rolling data log 33a-c, which contains a sufficient amount of monitoring data for event analysis, such as several minutes of data samples collected every few milliseconds. The data log constantly rolls over, maintaining a recent history phase current waveform file. The contents the data log is copied to a persistent local memory on the current sensor and uploaded to an analysis location in response to an event trigger. Each current sensor 32a-c is also configured to detect potential fault events and send "wake-up calls" to the other sensors upon detecting a potential fault event.

In this particular configuration, the line sensors 33a-c transmit their event log data to a remote transmitter unit (RTU) 23, which packages and relays the event data received from the current sensors 32a-c along with a local or GPS reference clock signal to the central controller 22. The RTU then sends an event data file including the three current wave forms containing historical data just prior to and following the detected event along with the reference clock signal and the event time marks for each current waveform to the central controller 22. The local or GPS reference clock signal may be maintained locally or acquired from GPS and may be maintained or acquired by the RTU, each current sensor individually, or by any selected sensor so long a common event time mark is ascribed to current waveform to place them on a common time scale when an event is detected. An event data package containing the three phase current waveform event histories and a common time scale or event time mark is sufficient for the central controller to sequence the phase currents to verify the presence of a high-impedance fault and identify the faulted phase. As an option, a voltage angle sensor 21 with its own data log 33d may also be included to allow the direction of the fault from the monitoring location to be determined.

As another option to simplify the computations, each of the sensors 33a-c and 21 may receive a common GPS clock signal used as a common time base and stored with the waveform data stored in the data logs. Alternatively, any one of the sensors, or another device such as the local controller 35, may operate a local clock that is used to generate a common time base upon event triggering. In this particular example, the RTU 23 may contain the local or GPS clock to provide the common time base.

Locating the current sequencing intelligence in the central controller 22 avoids duplication of the intelligence, allowing the RTU 23 to operate primarily as a data waypoint and local clock reference. In this role, RTU 23 accumulates the event data from the sensors 32a-c and 21, typically wirelessly, upon event detection and assembles an event file containing the three phase current waveforms, the voltage waveforms, and the reference clock signal for each event. The event data file is then transmitted to the central controller 22, which perform the phase sequence calculations (for this and any number of other monitoring stations that detected the triggering event), determines the faulted phase and directionality from this monitoring location (and from the other monitoring stations that detected the triggering event), and implements a coordinated sectionalizing scheme based on the event data from the various monitoring locations. The central controller 22 then returns switch control commands to the local controller 35 (when switch operation at this particular location is determined to be the appropriate response), and the local controller operates the switches 18a-c as indicated. This configuration saves power and minimizes data overhead by allowing all of the components to remain in a "silent mode" during normal operation, asynchronously recording event data and monitoring their respective parameters, until an event is detected by one of the sensors. Event detection triggers the wake-up call to the other sensors, event storage and uploading, and the resulting response operations.

The configuration shown in FIG. 2 is advantageous when off-the-shelf current sensors configured to perform event detection are to be used and the local switch controller is not amenable to modification. In addition, for a configuration in which off-the-shelf current sensors cannot be configured to perform event detection, the RTU 23 may be configured to perform the event detection functionality using the monitoring data provided by the current sensors 32a-c (and the voltage angle sensor 21 if desired). In this case, the sensors 32a-c (and optionally 21) communicate data continuously to allow the RTU to perform event detection continuously. This is not a problem for the current sensors, which can be inductively powered by the power line. The RTU may also be located near the power line and powered inductively by the power line, or it may be located near the ground and have an alternative power supply, such as a solar charged battery unit.

Figure 3:
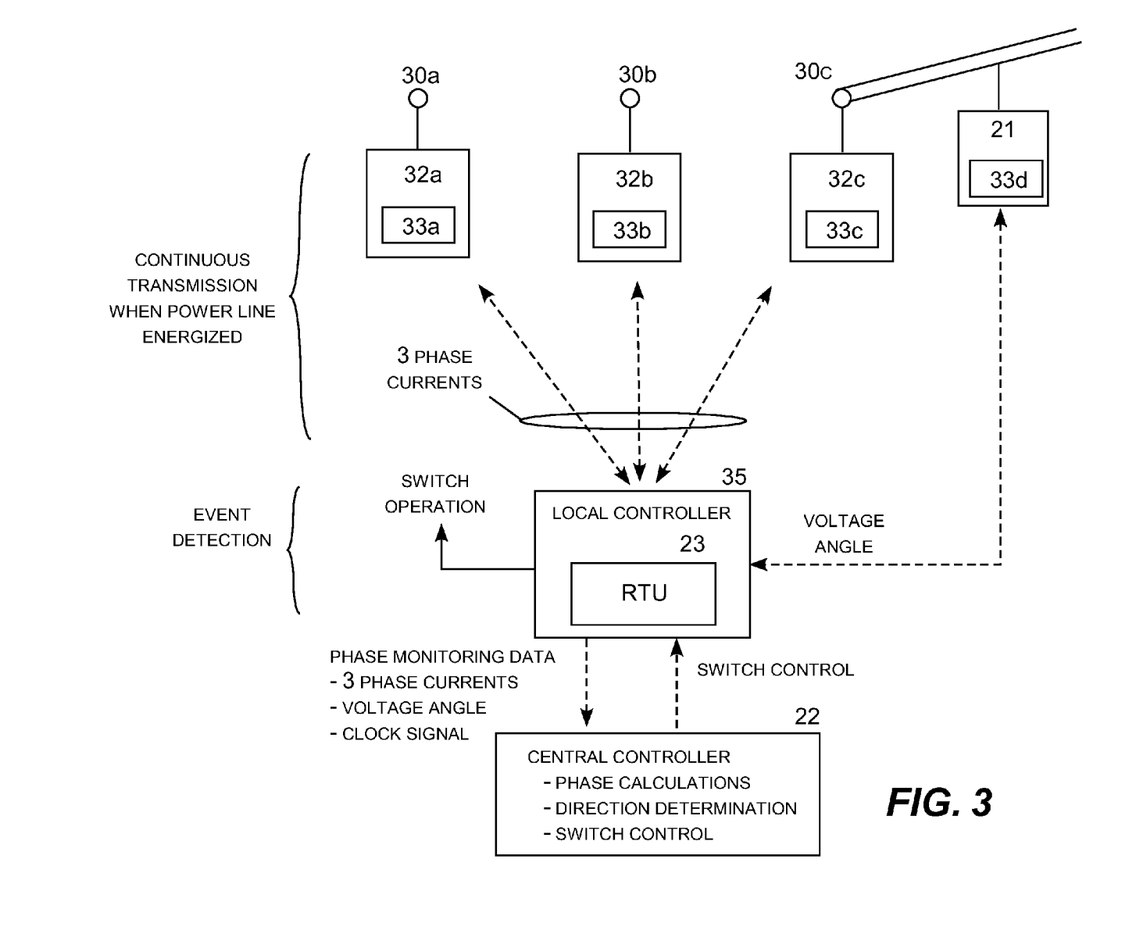
FIG. 3 is a block diagram of a first alternative configuration for the three phase high-impedance fault detection and direction detector.

FIG. 3 illustrates an alternative embodiment in which the RTU 23 shown in FIG. 2 has been incorporated into the local switch controller 35, which is an advantageous configuration when the switch controller is available for modification. When this option is available, locating the RTU in the local switch controller takes advantage of the preexisting cabinet, walk up access, electric service and the existing communication capability with the central controller already in place at the local controller. In addition, this configuration may be well suited to a system using off-the-shelf current sensors that are not configured to perform event detection by locating the event detection logic in the RTU within the local controller. For this configuration, the current and voltage angle sensors communicate data continuously, but this is not problematic because they remain inductively energized and operational whenever the power line is energized. In addition, the RTU remains energized and operational whenever the local controller is operational, which avoids the need for an auxiliary power supply.

Figure 4:
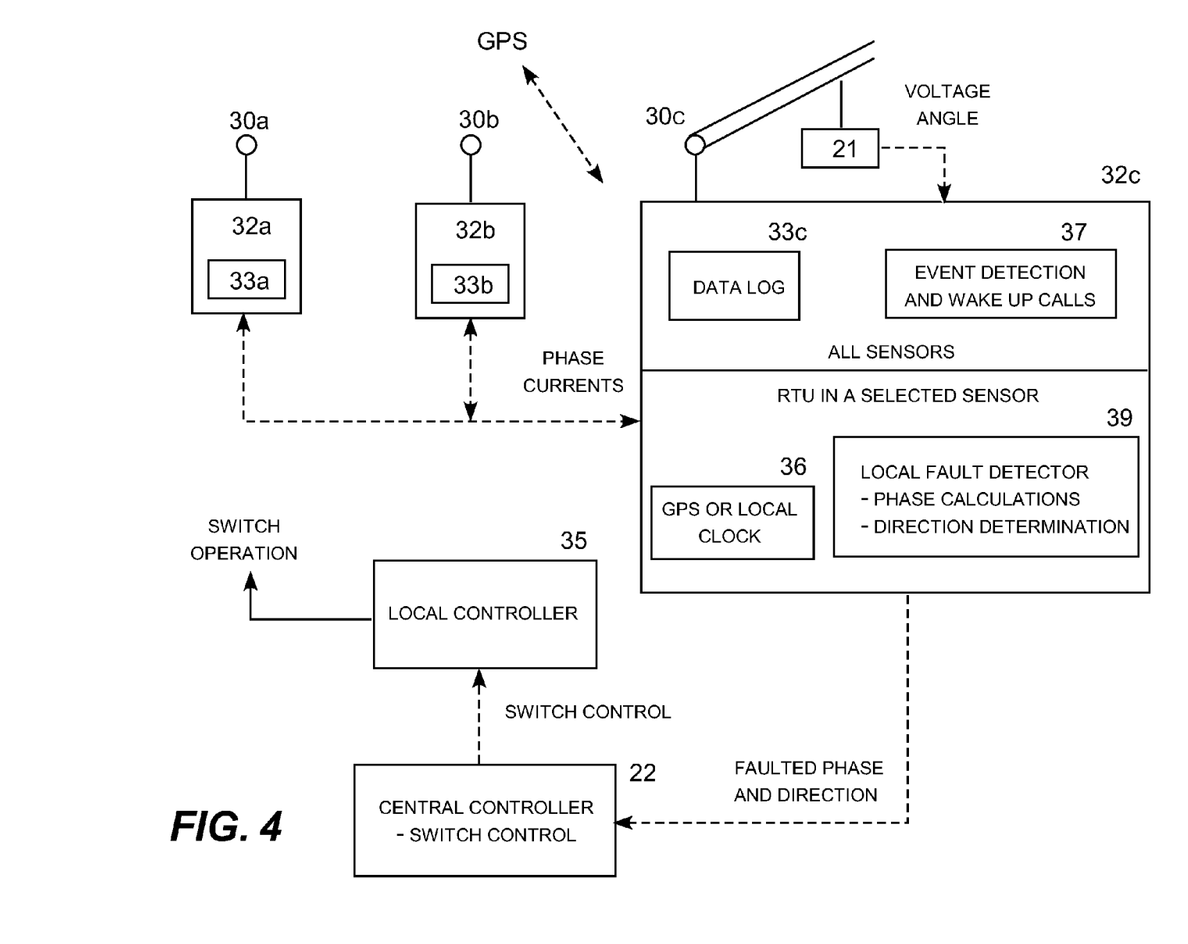
FIG. 4 is a block diagram of a second alternative configuration for the three phase high-impedance fault detection and direction detector.

FIG. 4 illustrates another alternative in which the RTU is incorporated into a selected sensor. If the current sensor unit is available for modification, much of the intelligence may be located in the sensor itself. This configuration provides the advantage of having the local power supply for the RTU functionality available through inductive coupling to the power line. This configuration also allows event detection at the sensor, which avoids the need for any communication to take place unless and until an event is detected. Once an event is detected, the detecting sensor sends a "wake-up call" to the other sensors causing them to locally store and upload their data logs. Any of the sensors or another local device can maintain a GPS or local clock to provide a common time base.

In this alternative, each current sensors 32a-c is configured to detect triggering events on its associated phase conductors and send wake-up calls to the other sensors upon event detection. This avoids the need for the current sensors 32a-c or the voltage sensor 21 to communicate with other devices until they detect a triggering event or receive a wake-up call from an event detecting sensor. In addition, for this option the sensors 32a-c and 21 may include GPS chips allowing them to record the synchronizing clock signal into their data logs. In addition to the rolling buffers 33a-d, each sensor 32a-c and 21 may also include a supply of persistent memory sufficient to store a number of event data records. Since the waveform data files each include a common GPS time base, the sensor with the RTU capability can be configured to perform the current sequencing, faulted phase identification, and fault directionality analysis with an inexpensive microprocessor. In this case, for each detected event the sensor configured with the intelligence and RTU capability sends an event file to the central controller 22 only when a high-impedance fault has been confirmed, and only need to indicate the time of the event, the faulted phase, and the direction from the monitoring station to the fault. The central controller 22 can then use this information from the various monitoring stations that detected the fault to operate the sectionalizing switches to isolate the fault.

Figure 5:
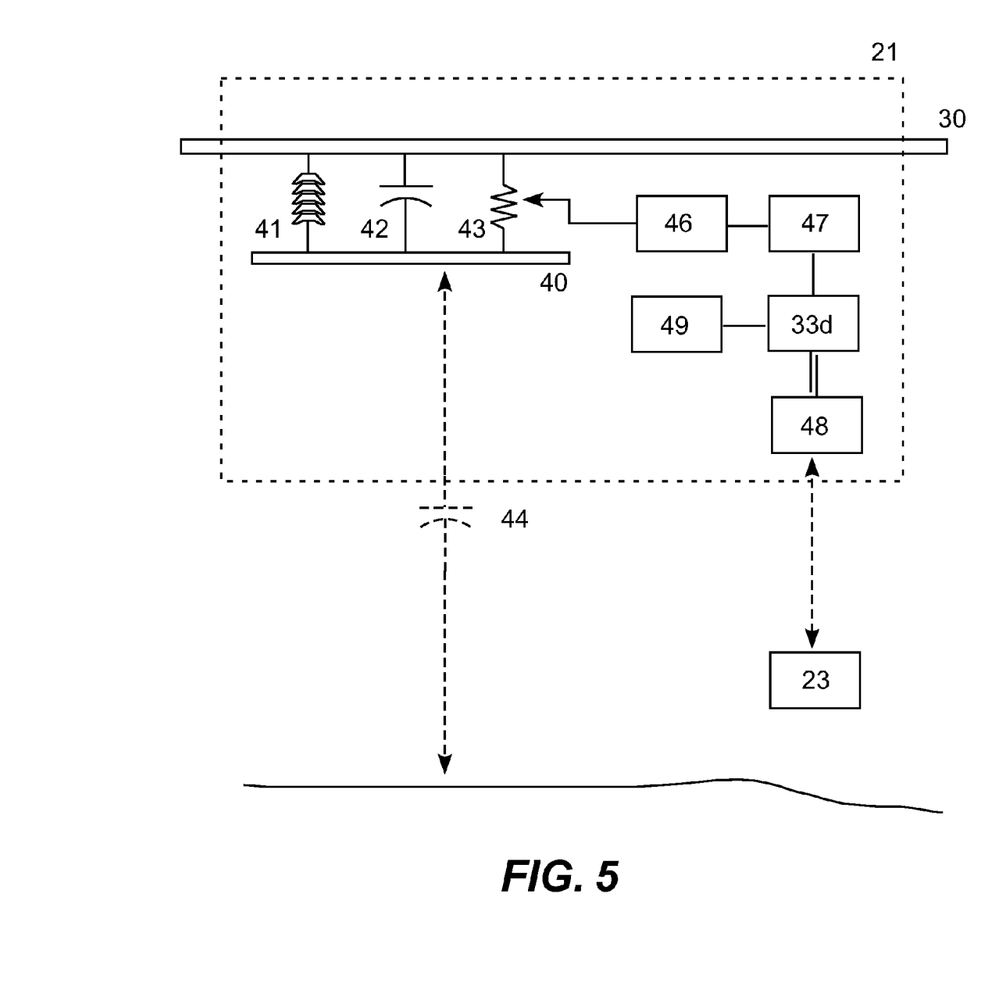
FIG. 5 is a block diagram of a voltage angle detector for three phase high-impedance fault detection and direction detector.

FIG. 5 is a block diagram of a low cost, line-mounted voltage angle sensor 21 suitable for use in the high-impedance fault detector connected to and supported from a phase conductor 30. The voltage angle sensor includes a conductive plate 40 spaced apart from the conductor 30 by an insulator 41. A capacitor 42 and a medium-ohm resistor voltage divider 43 are connected across the air gap between the conductor and the metal plate. There is a natural capacitance of about one pF in the air gap between the conductive plate 40 and the ground. A suitable capacitor 42 of about 500 pF and a resistor 43 of about 1,000 Ohms create a voltage divider between the capacitor 42 and the natural capacitance 44 dominated by the capacitor 42 and the resistor 43. The dominance of the resistor 43 prevents environmental factors, such as moist debris (crud) between the conductor 30 and the plate 40, from causing the voltage angle across the resistor 43 from varying greatly. That is because any conductive path between the conductor and the plate created by environmental crud will have a resistance far higher than the 1,000 Ohm value of the resistor 43 allowing the resistance of the path between the conductor and the plate to be dominated by the resistor.

Similarly, the dominance of the capacitor 42 prevents environmental changes, such as changes in humidity and the magnitude of the power flow in the line, from causing the voltage angle across the resistor 43 from varying greatly. That is because any change in the natural capacitance of the line 44 will be far smaller than the 500 pF value of the capacitor 42. It should also be noted that the plate 40 is strongly coupled to the power line 30 but only very weakly coupled to ground so that current flows in the voltage angle detectors are minimal, while the capacitor divider is dominated by the capacitor 42 and the resistor 43, which provides a stable voltage angle measurement at the resistor divider.

The resistor divider provides an analog voltage waveform (that is significantly impervious to changing environmental conditions) to an A/D converter 46, which provides a digitized waveform to the data log 33d. A radio or other suitable transmitter 48 provides the contents of the 33d to the RTU 23 for packaging with the other event data for transmission to the central controller 22 for event analysis. The sensor may also include a persistent memory 49 for locally storing a number of event data logs locally. The A/D converter 46 may also function as a power supply providing electric power inductively coupled from the power line to operate the other electronic components of the sensor.

Those skilled in the art will appreciate that the foregoing describes preferred embodiments of the invention and that many adjustments and alterations will be apparent to those skilled in the art within the spirit and scope of the invention as defined by the appended claims.

The invention claimed is:

1. A high-impedance fault detection and response system for a three phase electric power line having three phase conductors, comprising:
    a set of three current phase sensors, each electrically coupled to and asynchronously monitoring phase current flowing in an associated phase conductor;
    each current phase sensor having a data buffer for storing a recent history phase current waveform data file for its associated phase current;
    an event detector operative for event detection of a potential high-impedance fault on the electric power line;
    each current phase sensor operative for uploading its recent history phase current waveform data file in response to the event detection;
    a controller operative for receiving the recent history phase current waveform data files, computationally sequencing the phase current waveforms, and analyzing the sequence currents to verify that a high-impedance fault has occurred and identify a faulted phase involved in the high-impedance fault.

2. The high-impedance fault detection and response system of claim 1, wherein the controller or an associated remote controller is further operative for determining and activating a switch operation to isolate the faulted phase.

3. The high-impedance fault detection and response system of claim 1, wherein:
    each current phase sensor comprises an event detector operative for event detection of a potential high-impedance fault on its associated phase conductor of the electric power line;
    each current phase sensor is further operative to send wake-up calls to the other phase current sensors upon event detection and receive wake-up calls from the other phase current sensors upon event detection by those sensors;
    each current phase sensor is further operative to upload its recent history phase current waveform data file in response to event detection or receipt of a wake-up call from another sensor.

4. The high-impedance fault detection and response system of claim 1, further comprising a remote transmission unit (RTU), and wherein:
    each current phase sensor continuously uploads phase current monitoring data to the RTU, and
    the RTU comprises an event detector operative for event detection of potential high-impedance faults on each phase conductor of the electric power line.

5. The high-impedance fault detection and response system of claim 4, wherein the RTU is located with a selected current phase sensor.

6. The high-impedance fault detection and response system of claim 4, further comprising a switch operative for disconnecting the electric power line in response to a switch control signal from the controller, wherein the RTU is located with the switch.

7. The high-impedance fault detection and response system of claim 1, further comprising a voltage angle sensor, wherein the controller is further operative to determine a direction of high-impedance fault from a monitoring location associated with the voltage angle sensor to a location of occurrence of the fault.

8. The high-impedance fault detection and response system of claim 7, wherein the remote controller is operative for determining the direction of the high-impedance fault.

9. The high-impedance fault detection and response system of claim 7, wherein a remote transmission unit (RTU) at the monitoring location is operative for determining the direction of the high-impedance fault.

10. The high-impedance fault detection and response system of claim 9, wherein the RTU is located with a selected current phase sensor.

11. A high-impedance fault detection and response system for a three phase electric power line having three phase conductors, comprising:
a plurality of electric switch controllers, each operative for controlling an electric power switch for disconnecting the electric power line at a respective location;
a remote controller operative for control operation of the electric switch controller to isolate faults detected on the electric power line;
a plurality of current monitoring stations, each associated with each electric switch controller, wherein each current monitoring station comprises:
a set of three current phase sensors, each electrically connected to and asynchronously monitoring phase current flowing in an associated phase conductor, each current phase sensor having a data buffer for storing a recent history phase current waveform data file for its associated phase current,
a voltage angle sensor having a data buffer for storing a recent history voltage angle waveform data file for the voltage angle;
an event detector operative for event detection of a potential high-impedance fault on the electric power line,
each current phase sensor and the voltage angle sensor operative for uploading its recent history waveform data file in response to the event detection;
wherein the remote controller is further operative for:
receiving the recent history waveform data files from the phase current sensors and the voltage angle sensor at each monitoring station,
computationally sequencing the waveforms corresponding to the phase currents at each monitoring station,
analyzing the sequence currents at each monitoring station to verify that a high-impedance fault has occurred, identify a faulted phase involved in the high-impedance fault, and determine a direction to the fault from each monitoring station,
identifying a selected switch controller for operation to isolate the fault based on the direction to the fault from each monitoring station; and
controlling the operation of the selected switch controller to isolate the fault.

12. The high-impedance fault detection and response system of claim 11, wherein for each current monitoring station:
each current phase sensor comprises an event detector operative for event detection of a potential high-impedance fault on its associated phase conductor of the electric power line;
each current phase sensor is further operative for sending wake-up calls to the other sensors upon event detection and receiving wake-up calls from the other sensors upon event detection by the other sensors;
each current phase sensor is further operative for uploading its recent history waveform data file in response to event detection or receipt of a wake-up call from another sensor.

13. The high-impedance fault detection and response system of claim 11, further comprising a remote transmission unit (RTU) for each current monitoring station, and wherein for each current monitoring station:
each current phase sensor continuously uploads phase current monitoring data to the RTU, and
the RTU comprises an event detector operative for event detection of potential high-impedance fault on each phase conductor of the electric power line.

14. A method for detecting and responding to high-impedance faults on an electric power line, comprising:
locating a monitoring station on the electric power line comprising an asynchronous data logging phase current sensors electrically coupled to each phase conductor of the electric power line;
generating and event trigger in response to the detection of a potential high-impedance faults on the power line;
uploading a historical phase current waveform data file from each phase current sensor in response to an event trigger;
computationally sequencing the phase current waveforms to verify the verify that a high-impedance fault has occurred and identify a faulted phase involved in the high-impedance fault; and
controlling the operation of a selected switch to isolate the verified high-impedance fault.

15. The methods of claim 14, further comprising the steps of:
locating a data logging voltage angle detector at the monitoring station;
uploading a voltage angle waveform data file from the voltage angle detector in response to the event trigger;
determine a direction to the fault from the monitoring station based on the voltage angle waveform, and
identifying a selected switch controller for operation to isolate the fault based on the direction to the fault from the monitoring station.

* * * * *